United States Patent [19]

Tsuzuki et al.

[11] Patent Number: 5,136,348
[45] Date of Patent: Aug. 4, 1992

[54] STRUCTURE AND MANUFACTURING METHOD FOR THIN-FILM SEMICONDUCTOR DIODE DEVICE

[75] Inventors: Yukio Tsuzuki, Aichi; Masami Yamaoka, Anjo; Hiroshi Muto, Kariya, all of Japan

[73] Assignee: Nippondenso Co., Ltd., Kariya, Japan

[21] Appl. No.: 647,194

[22] Filed: Jan. 28, 1991

Related U.S. Application Data

[63] Continuation of Ser. No. 440,445, Nov. 22, 1989, abandoned, which is a continuation of Ser. No. 105,658, Oct. 8, 1987, abandoned.

[30] Foreign Application Priority Data

Oct. 8, 1986 [JP] Japan .................. 61-239658

[51] Int. Cl.$^5$ .............. H01L 29/06; H01L 29/04; H01L 23/32
[52] U.S. Cl. .................... 357/20; 357/59; 357/76
[58] Field of Search .............. 357/59, 20, 76

[56] References Cited

U.S. PATENT DOCUMENTS

| 3,950,036 | 4/1976 | Fink et al. |
|---|---|---|
| 3,988,769 | 10/1976 | Anthony et al. ............ 357/60 |
| 4,178,396 | 12/1979 | Okano et al. ............... 357/24 |
| 4,492,974 | 1/1985 | Yoshida et al. |
| 4,707,720 | 11/1987 | Shirai et al. ............... 357/59 A |
| 4,760,434 | 7/1988 | Tsuzuki et al. ............. 357/59 A |
| 4,896,199 | 1/1990 | Tsuzuki et al. ............. 357/59 A |

FOREIGN PATENT DOCUMENTS

| 0075833 | 9/1982 | European Pat. Off. |
|---|---|---|
| 183562 | 6/1986 | European Pat. Off. |
| 190423 | 1/1988 | European Pat. Off. |
| 87308923.9 | 6/1988 | European Pat. Off. |
| 0253014 | 4/1990 | European Pat. Off. |
| 2212618 | 9/1973 | Fed. Rep. of Germany |
| 2142144 | 8/1976 | Fed. Rep. of Germany |
| 2706132 | 9/1983 | Fed. Rep. of Germany |
| 21952895 | 10/1988 | Fed. Rep. of Germany |
| 54-29984 | 3/1979 | Japan |
| 57-141962 | 9/1982 | Japan |
| 58-151051 | 9/1983 | Japan |
| 1414341 | 11/1975 | United Kingdom |

OTHER PUBLICATIONS

"ULSI Technology", S.M. Sze, McGraw-Hill, 1988, 1983, pp. 131–132.
"I-V Characteristics of Polycrystalline Silicon with n+pn+ Structure", J. Appl. Phys 57(4) Feb. 15, 1985, pp. 1190–1193, Y. Saito et al.

Primary Examiner—Andrew J. James
Assistant Examiner—Mahshid Saadat
Attorney, Agent, or Firm—Cushman, Darby & Cushman

[57] ABSTRACT

A structure and manufacturing method for a thin film semiconductor device consisting of a single diode or a plurality of diodes connected in series, the device being formed of at least one pair of mutually adjacent P-type (23a) and N-type (23b) regions formed in a layer of polycrystalline silicon (23) deposited on an insulating film (22) upon a substrate (21), to thereby define at least one PN junction. Each of the p-type regions and N-type regions is shaped as a rectangle, with opposite ends of each PN junction formed between these regions being respectively defined by two opposing sides of the polycrystalline silicon layer. Since each of the PN junctions is substantially rectilinear, an even distribution of current flow through each PN junction is attained, whereby a high resistance to destruction and an extremely stable value of reverse bias breakdown voltage are achieved.

6 Claims, 9 Drawing Sheets

A

B

STRUCTURE AND MANUFACTURING METHOD FOR THIN-FILM SEMICONDUCTOR DIODE DEVICE

This is a continuation of U.S. patent application Ser. No. 07/440,445, filed on Nov. 22, 1989, which was abandoned upon the filing hereof which is a continuation of U.S. patent application Ser. No. 07/105,658 filed Oct. 8, 1987, now abandoned.

BACKGROUND OF THE INVENTION

The present invention relates to a structure and method of manufacture for a semiconductor device which is configured as a one or more PN junctions within a polycrystalline silicon layer formed upon a thermal oxidation insulating film which covers a surface of a semiconductor substrate.

Semiconductor devices are known in the art which are formed as PN junctions upon an insulating film that is formed over a semiconductor substrate, for example as described in Japanese patent laid-open No. 58-151051, and in U.S. Pat. No. 4,492,974. Since no parasitic action occurs within such a semiconductor device, a plurality of elements can readily be configured as a set of PN junctions which are connected in series, and such a device has a wide range of applicability. For example, such a device is suitable for use as a temperature sensing element which employs the diode forward voltage temperature characteristic.

FIGS. 1, 2 and 3 show a specific example of a prior art semiconductor device which is configured as a plurality of diodes connected in series. FIG. 1 shows a cross-sectional view, FIG. 2 a plan view, and FIG. 3 the electrical circuit of the device. Reference numeral 10 denotes a semiconductor substrate having an insulating film 11 formed on a main surface thereof. A layer of polycrystalline silicon 12, referred to in the following as a polycrystalline silicon "island", is formed upon a predetermined region of the insulating film 11. Regions of the polycrystalline silicon island 12 are selectively doped with phosphorus or boron by ion implantation, to form a plurality of successively adjacently positioned annular N+ regions 12a and P+ regions 12b, disposed in a mutually concentric fashion, in a successively alternating manner as shown. An oxide film 13 is formed over this polycrystalline silicon island 12, and a surface protection film 14 is then formed thereon. Lead-out apertures are then formed, and electrodes 15a and 15b are then formed to respectively contact the innermost one of the N+ regions 12a and the outermost one of the N+ regions 12a. This completes the manufacture of the semiconductor device.

However with such a semiconductor device, the current-carrying capacity of the PN junctions is determined by the maximum current density per unit length of a PN junction. Thus, the current-carrying capacity of the entire semiconductor device is determined by that of the PN junction which has the shortest junction length, i.e. the peripherally innermost PN junction. As a result, an increase in the current-carrying capacity of such a device can only be attained by increasing the length of this peripherally innermost PN junction. Hence, the length of the peripherally outermost PN junction must be increased accordingly, whereby the overall area which is occupied by the PN functions of the device may become excessively large, i.e. the efficiency of area utilization is low. Furthermore with such a prior art configuration, one of the P+ regions 12b is disposed at the peripherally inward side of each of the N+ regions 12a, i.e. regions of different conduction type are disposed closely adjacent. Similarly, there is an N+ region 12a disposed at the peripherally inward side of each P+ region 12b, and corner portions of the resultant P-N junctions are formed, at which there is a high concentration of current flow. As a result, the level of applied energy at which device destruction begins (i.e. where applied energy is defined as the product of voltage applied across the device and device current) is lowered due to the excessive concentration of current flow which occurs at each of these PN junction corner portions.

SUMMARY OF THE INVENTION

It is a first objective of the present invention to provide a thin-film diode semiconductor device which is capable of providing a high degree of device integration.

It is a second objective of the present invention to provide a thin-film diode semiconductor device having a high value of energy at which device destruction occurs.

It is a third objective of the present invention to provide a thin-film diode semiconductor device having an improved degree of stability of reverse-bias breakdown voltage.

To attain the above objectives, a semiconductor device according to the present invention is configured as a layer of polycrystalline silicon which is formed upon a predetermined region of an insulating film which covers a substrate surface, with mutually adjacent P-type regions and N-type regions formed in said polycrystalline silicon layer, each of said regions being of rectangular shape, to thereby form at least one PN junction extending substantially rectilinearly, with respective ends of said PN junction being defined by two opposing sides of said polycrystalline silicon layer.

To manufacture a semiconductor device according to the present invention, a method is utilized comprising:

a step of forming an insulating film upon a substrate;

a step of forming a layer of polycrystalline silicon upon a predetermined region of said insulating film;

a step of performing oxidation of a surface of said polycrystalline silicon layer to form a first thermal oxidation film;

a step of removing said first thermal oxidation film;

a step of again performing oxidation of said surface of said polycrystalline silicon layer to form a second thermal oxidation film;

a step of performing selective implantation of impurities in predetermined regions of said polycrystalline silicon layer such as to form at least one P-type region and at least one N-type region disposed mutually adjacent, each of said P-type region and N-type region being of rectangular shape, to thereby form at least one PN junction having opposite ends thereof defined by two opposing sides of said polycrystalline silicon layer and;

a step of forming connecting leads of predetermined shape upon predetermined regions of said polycrystalline silicon layer.

DESCRIPTION OF PREFERRED EMBODIMENTS

Figure 4A:
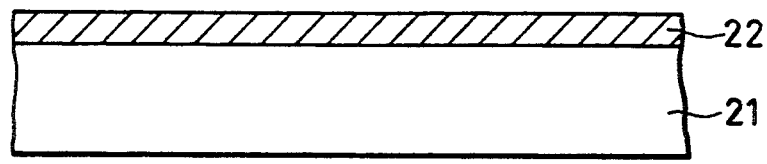
FIGS. 4(a) to (g) are cross-sectional views for illustrating a manufacturing processing sequence of a first embodiment of the present invention.
Figure 4B:
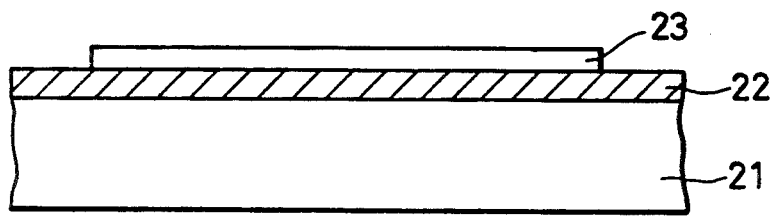
Figure 5:
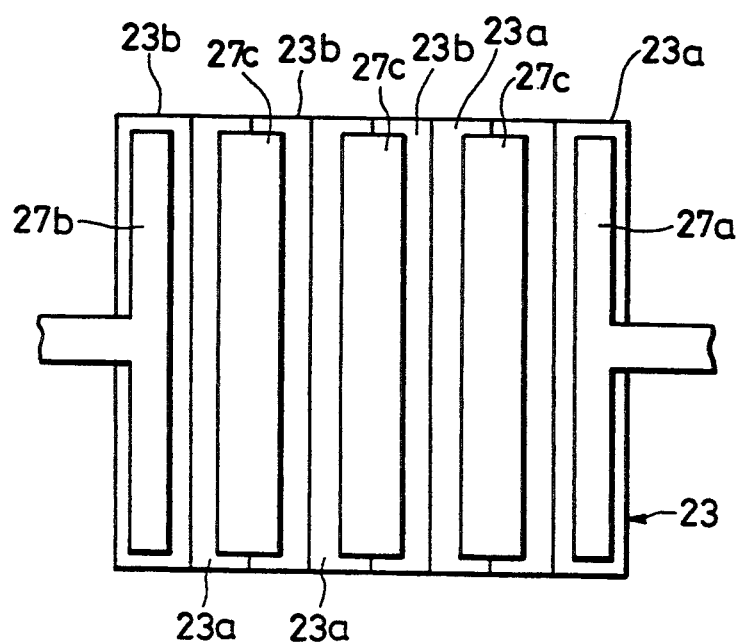
FIG. 5 is a plan view of a first embodiment of a semiconductor device according to the present invention.
Figure 6:
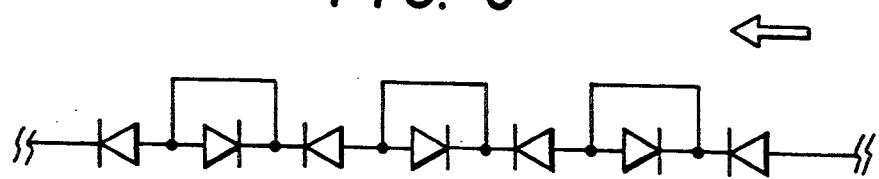
FIG. 6 is a an electrical circuit diagram of the first embodiment.

A first embodiment of a semiconductor device according to the present invention, and the method of manufacture of this embodiment, will be described referring to FIGS. 4(a) to 4(g), 5 and 6. FIGS. 4(a) to 4(g) are cross-sectional views for illustrating successive steps in the manufacturing process for the first embodiment, FIG. 5 is a plan view of a semiconductor device according to the first embodiment, and FIG. 6 is an electrical circuit diagram of this embodiment. The process of manufacturing the device is as follows. Firstly, as shown in FIG. 4(a), an insulating film 22 consisting of a thermal oxidation film is formed over the entire area of a main surface of a semiconductor substrate 21 which is formed of a material such as single-crystal silicon. The insulating film 22 is formed by thermal oxidation to a thickness of approximately 1 $\mu$m, under conditions of 1050° C. temperature, and wet Hcl. Next, as shown in FIG. 4(b), a layer of non-doped polycrystalline silicon is formed on the insulating film 22 to a thickness of approximately 4000 Å, by a process such as CVD (chemical vapor deposition) under deposition conditions of approximately 600° C. Patterning of the resultant polycrystalline silicon layer is then executed, by lithography and dry etching process, such as reactive ion etching (RIE). A single "island" 23 of polycrystalline silicon is thereby formed upon the insulating film, having a predetermined area and at a predetermined position. The surface of the polycrystalline silicon island 23 will not be smooth, but will contain convex and concave irregularities, as a result of the effects of variations in the deposition conditions during deposition of the polycrystalline silicon layer, and the effects of the RIE etching process, etc.

Figure 4C:
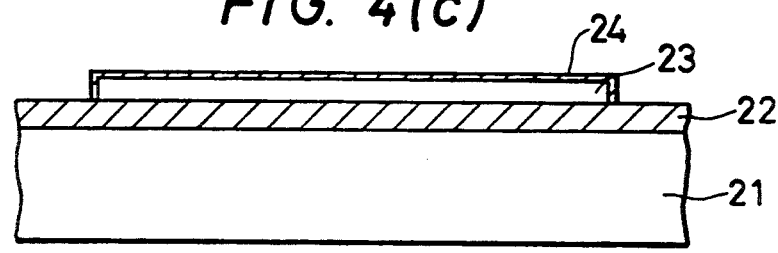

Next, as shown in FIG. 4(c), thermal oxidation of the surface of the polycrystalline silicon island 23 is performed at a temperature in the range 900° to 1200° C., preferably under conditions of approximately 1050° C. temperature and a dry $O_2$ gas atmosphere, to thereby form an oxide film 24 to a thickness which is in the range 600 to 700 Å. The thermal oxidation film 24 which is thus formed will conform to the irregularities which exist on the surface of the polycrystalline silicon island 23 prior to this step of oxidation. However upon completion of this step of thermal oxidation, the surface of the polycrystalline silicon island 23 will become substantially flat and smooth.

Figure 4D:
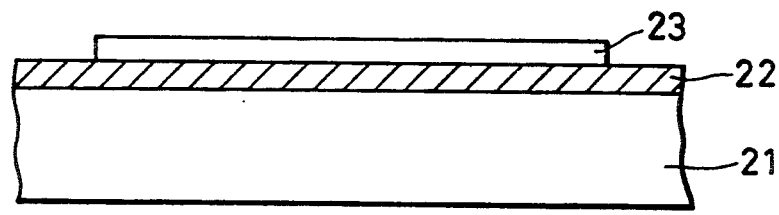
Figure 4E:
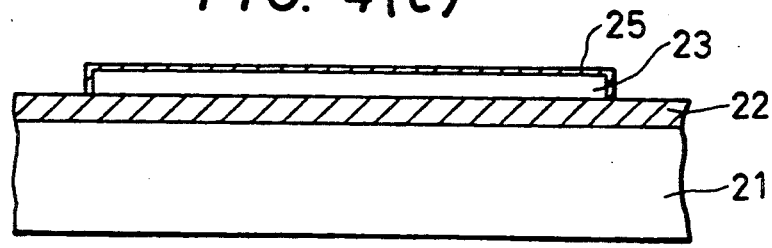
Figure 7:
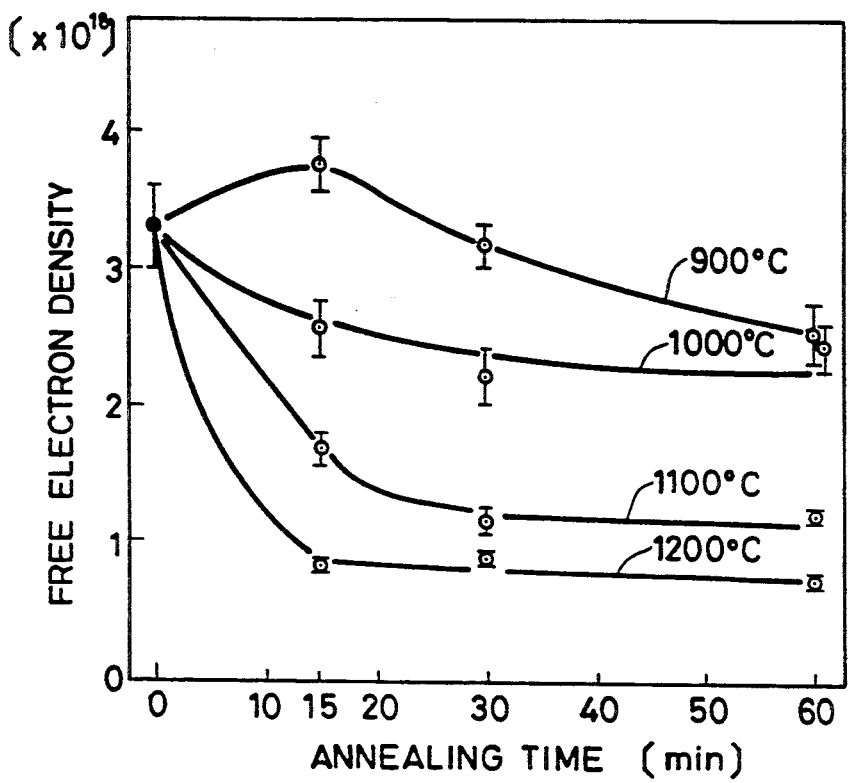
FIG. 7 is a graph showing the relationship between annealing time and temperature, and density of free electrons.

Next, as shown in FIG. 4(d), the thermal oxidation film 24 is removed by lithography and etching, (for example by using a fluoric acid solvent). As shown in FIG. 4(e), thermal oxidation is then again performed, to form a thermal oxidation film 25 having a thickness which is in the range 500 to 700 Å. The processing conditions in this case are preferably a temperature of 1000° C. approximately, a dry $O_2$ gas atmosphere, and a duration of approximately 50 minutes, followed by an $N_2$ gas atmosphere for approximately 20 minutes. Due to the fact that this thermal oxidation film 25 is formed upon a surface of the polycrystalline silicon island 23 which has been made substantially flat and smooth, the surface of the thermal oxidation film 25 itself will also be substantially flat and smooth. High temperature annealing is now performed, e.g. at a temperature of approximately 1170° C., in an inert gas atmosphere such as $N_2$, for 170 minutes, to thereby improve the quality of the polycrystalline silicon. As shown in FIG. 7, if this high temperature annealing is carried out at a temperature which is higher than 1100° C., and for a time which of 15 minutes of more, then the free electron density in the polycrystalline silicon can be lowered, and minute defects can be reduced. A significant improvement in the quality of the polycrystalline silicon can thereby be attained.

Figure 4F:
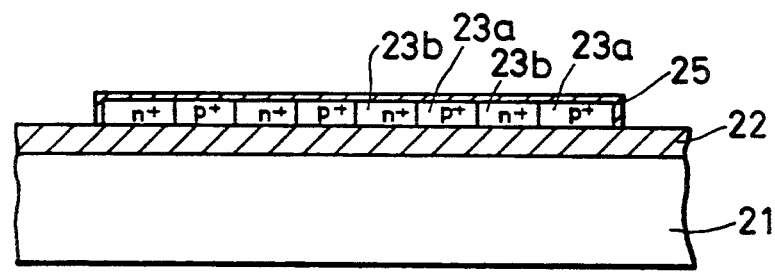
Figure 4G:
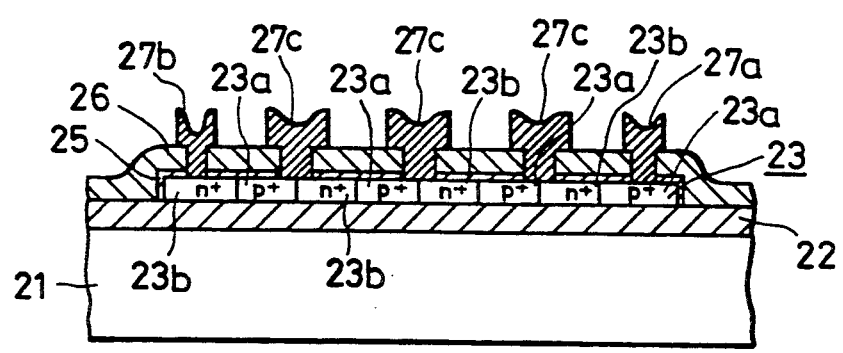

Next, a series of steps are performed consisting of coating with resist and exposure to light, selective removal of the resist, followed by ion implantation. As a result, as shown in FIG. 4(f), P+ regions 23a and N+ regions 23b are formed in the polycrystalline silicon island 23. To form the P+ regions 23a, implantation of an impurity such as boron is executed, utilizing 40 KeV and $8 \times 10^{14}$ dose. The N+ regions 23b are formed by implantation of an N-type impurity such as phosphorus, using 100 KeV and $5 \times 10^{15}$ dose. As shown in FIG. 5, each of the regions of the N+ regions 23b and P+ regions 23a is formed in the shape of a rectangle, with successively positioned ones of the N+ regions 23b and P+ regions 23a being disposed mutually adjacent, in a sequentially alternating manner as shown. In this way a plurality of PN junctions are formed at substantially equidistant spacings, extending from one edge of the polycrystalline silicon island 23 to the opposite edge thereof. Terminals of the set of PN junctions thus produced are formed on portions of the polycrystalline silicon island 23 adjacent to the aforementioned opposing edges of island 23. Next, thermal processing is performed at a temperature in the range 1000° to 1100° C., for 20 minutes or more, in an inert gas atmosphere such as $N_2$. In this processing, driving in of the impurities which have been implanted in the polycrystalline silicon is performed while at the same time boron is drawn out of the P+ regions 23a to be shifted to an insulating layer to perform segregation. This withdrawal of boron makes use of a difference between the segregation coefficients of boron and phosphorus. As a result of this processing, the surface concentration is lowered, thereby increasing the breakdown voltage of the completed device.

Next, as shown in FIG. 4 (g), an inter-layer insulating film 26 consisting of BPSG deposited to a thickness of approximately 7000 Å is formed upon the thermal oxidation film 25 of the polycrystalline silicon island 23, and lead-out apertures are formed in this inter-layer insulating film 26. Electrodes 27a and 27b are then respectively formed, of a material such as Al-Si, on one of the P+ regions 23a which is positioned adjacent to one edge of the polycrystalline silicon island 23, and one of the N+ regions 23b which is positioned adjacent to the opposite edge of island 23, and a set of electrodes 27c are formed such as to electrically connect each of mutually adjacent pairs of the N+ regions 23b and P+ regions 23a as shown.

The device which is formed by the manufacturing process described above consists of a plurality of diodes which are connected in series as shown in FIG. 6. In FIG. 6, the arrow indicates the direction of forward current flow.

With the first embodiment of the present invention described above, a plurality of PN junctions are formed, each having a junction length which is identical to the width of the polycrystalline silicon island 23. Thus, it is not necessary to provide excessively long junction portions such as are required in the case of the prior art device described hereinabove with reference to FIGS. 1, 2 and 3. Hence, excellent efficiency of area utilization is attained with this first embodiment of the present invention, enabling a high level of device integration to be implemented.

Figure 1:
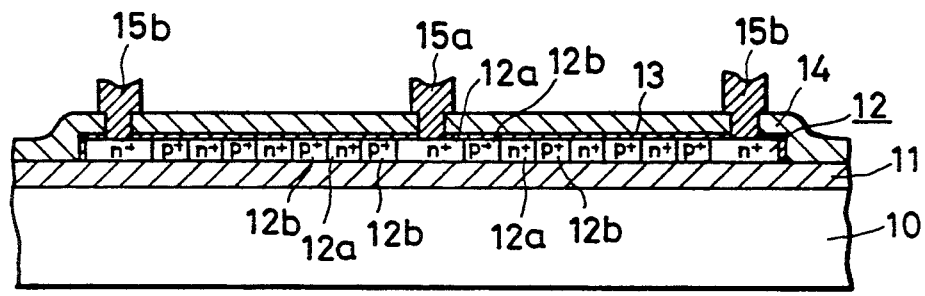
FIG. 1 is a cross-sectional view of a semiconductor device which has been proposed in the prior art.
Figure 2:
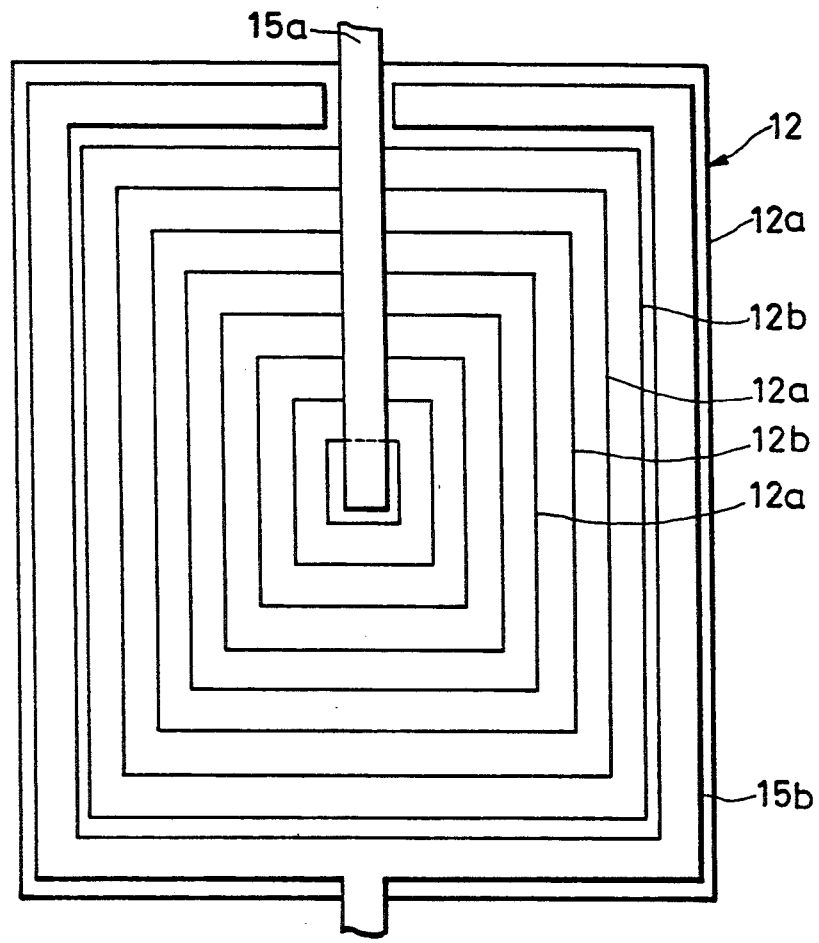
FIG. 2 is a plan view of the device of FIG. 1.
Figure 3:
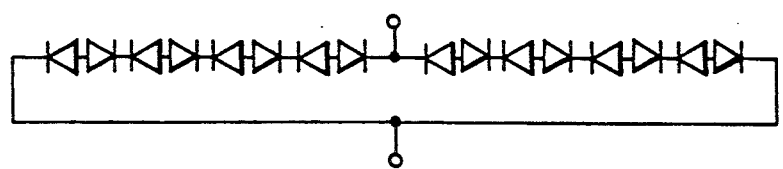
FIG. 3 is an electrical circuit diagram of the device of FIG. 1.

Furthermore with the first embodiment of the present invention described above, if the PN junction length is assumed to be designed to be equal to that of PN junction length of the peripherally innermost PN junction in the prior art example of FIGS. 1 to 3, then the first embodiment of the present invention will provide a reduction of required area by a factor of ⅓ by comparison with that prior art device.

Figure 8:
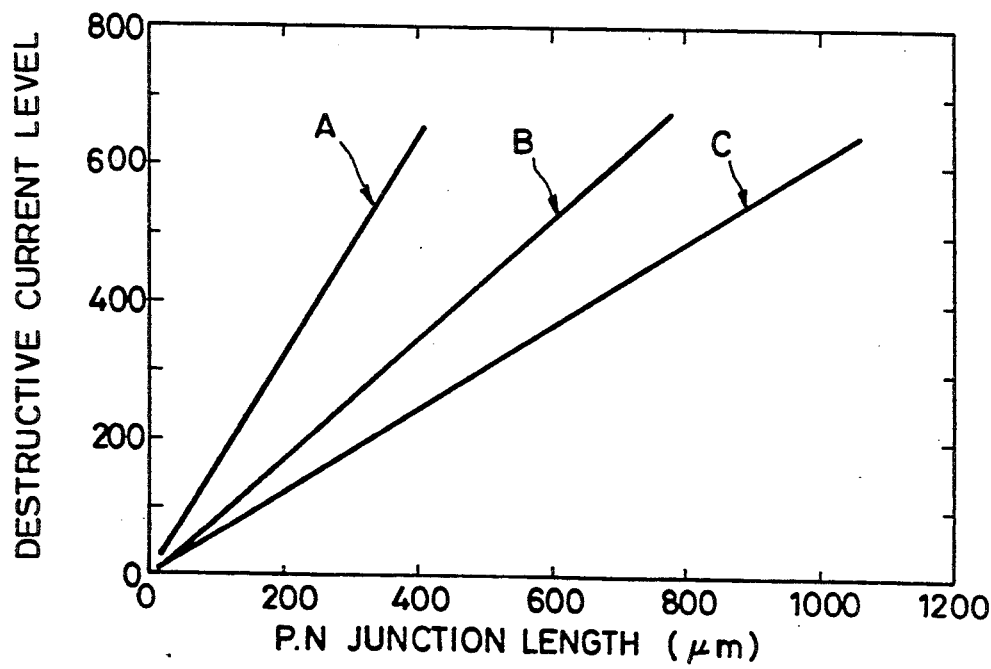
FIG. 8 shows relationships between PN junction length and destructive level of current.
Figure 9A:
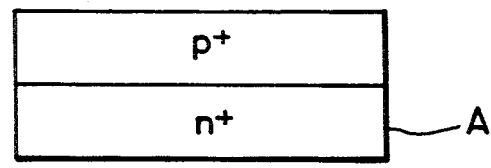
FIGS. 9(a) to (c) are conceptual plan views for illustrating various diode configurations, where.
Figure 9B:
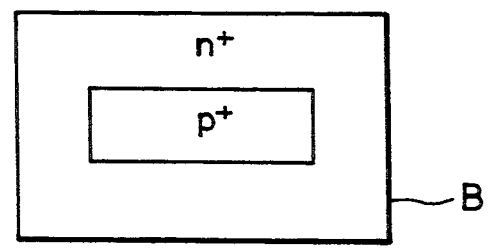
Figure 9C:
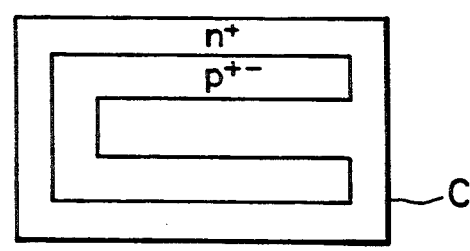

With the first embodiment of the present invention described above, a plurality of PN junctions are formed which extend from one side of the polycrystalline silicon island 23 (which is formed in a rectangular shape) to the opposite side, positioned at equidistant spacings. It should be noted that the term "side" as applied in this description and in the appended claims to a polycrystalline layer or to a region of such a layer has the significance of a linear portion of the peripheral bounder of that layer or region, extending between two corners of that boundary, as viewed in a direction normal to the substrate plane. Terminals of the device are formed adjacent to these opposing sides of the island 23. Due to this configuration, no corners of PN junctions are formed, so that concentration of current flow such as that described for the example of FIGS. 1 to 3 does not occur, i.e. an even distribution of current flow is achieved throughout each of the PN junctions. Thus, the level of applied energy at which device destruction begins (as defined hereinabove) is reduced. FIG. 8 graphically illustrates relationships between PN junction length and levels of maximum current against destruction, with curve A being the characteristic in the case of a diode which is manufactured by utilizing the technical concepts of the present invention, i.e. a diode having a structure as illustrated in the conceptual plan view of FIG. 9(a). This type of diode will be referred to in the following as sample A. Curve B is the characteristic for the case of a prior art type of diode having a P+ region formed within an N+ region, as illustrated in FIG. 9(b), this diode being referred to in the following as sample B. Curve C is the characteristic for the case of a diode which is formed by a prior art process, which is shaped such that each PN junction includes a number of corner portions. This diode will be referred to in the following as sample C. The respective values of destructive current density (where destructive current density=maximum current against destruction/PN junction length) obtained from these characteristics are as follows. In the case of characteristic A, 1.65 mA/$\mu$m, for characteristic B, 0.88 mA/$\mu$m, and for characteristic C, 0.61 mA/$\mu$m. It can thus be understood that the lower the number of corner portions of the PN junction of a diode, the lower will be the destructive current density, and that sample A provides the highest level of destructive current density. Thus, if each of these types of diode were required to have an identical value of maximum current against destruction, then sample A would have the shortest PN junction length and hence would occupy the smallest area. As described above, sample A provides the highest value of maximum current against destruction due to the fact that an even distribution of current flow in the PN junction is attained.

Figure 10A:
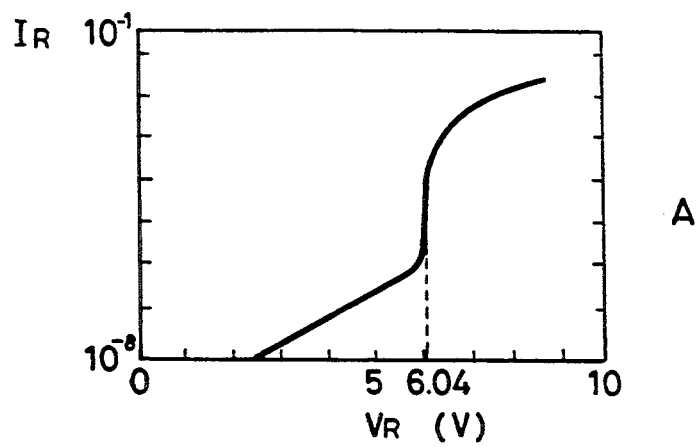
FIGS. 10(a) and (b) show respective voltage/current electrical characteristics of diodes shown in FIGS. 9(a) and (b)
Figure 10B:
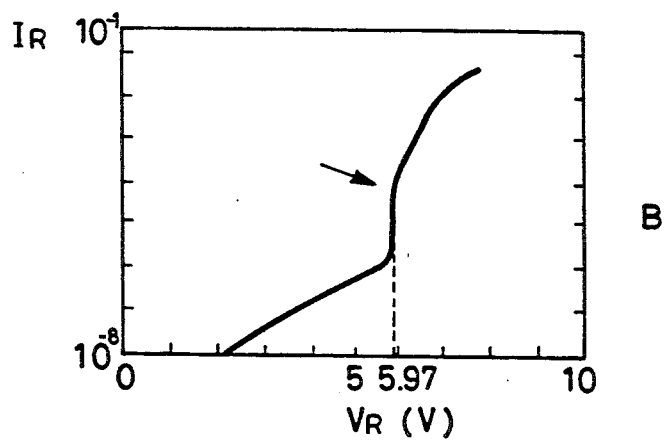
FIG. 10 (c) is an electrical circuit diagram to illustrate a measurement condition for FIGS. 10(a) and (b)
Figure 10C:
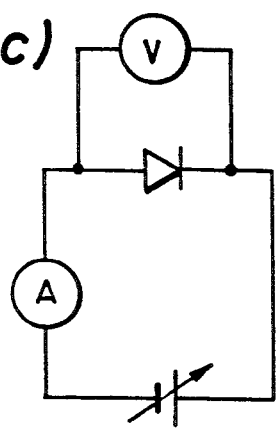
Figure 11:
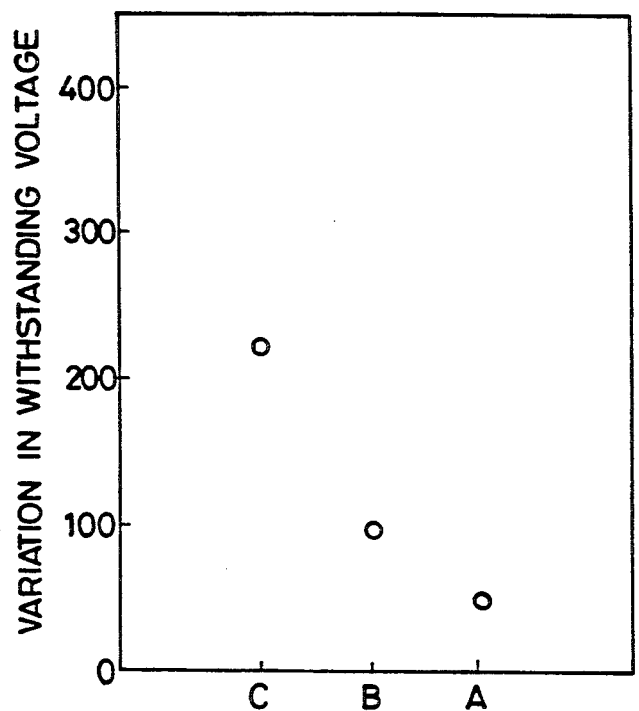
FIG. 11 is a diagram showing levels of breakdown voltage of the diodes of FIGS. 9(a) to (c)
Figure 12:
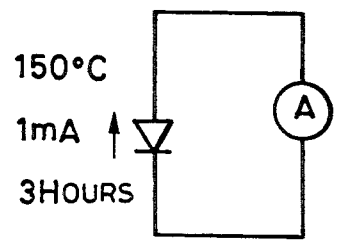
FIG. 12 is an electrical circuit diagram for illustrating measurement conditions of FIG. 11.

FIGS. 10(a) and 10(b) show voltage/current characteristics when a reverse bias voltage applied to a diode which is connected in the circuit of FIG. 10 (c). FIG. 10(a) shows the characteristic for the case of sample A of FIG. 9(a) described above, while FIG. 10(b) shows the characteristic for the case of sample B of FIG. 9(b). The respective values of breakdown voltage are 6.04 V for sample A, and 5.97 V for sample B. It can thus be understood that a diode configuration according to the present invention provides the higher value of breakdown voltage. It is important to note the bend portion in the characteristic of FIG. 10(b), indicated by the arrow in that figure. This bend portion corresponds to breakdown occurring at a corner portion of a PN junction region. Specifically, two types of breakdown occur, i.e. that which occurs in a corner portion of a PN junction and that which occurs in a linear portion of a junction. The value of breakdown voltage in the case of a corner portion is lower than that of a linear portion of a PN junction, and this is the reason for the occurrence of the aforementioned bend in the characteristic. FIG. 11 is a diagram showing respective amounts of change in the value of breakdown voltage which occur during a specific period of operation at high temperature, for each of the diode samples A, B and C described above. The values shown in FIG. 11 were obtained by connecting each type of diode in a circuit of the form shown in FIG. 12, and passing a current of 1 mA through the diode for 3 hours at a temperature of 150° C. As can be understood from FIG. 11, sample A displays by far the lowest amount of variation of breakdown voltage by comparison with samples B and C. It can thus be understood that a diode manufactured by the method of the present invention is highly suited for use as a zener diode, since a highly stable voltage/current characteristic can be obtained.

The effects obtained by the present invention have been described in the above on the basis of data obtained from experiments. In the manufacturing process for the first embodiment described above, the following measures are taken in order to increase the value of maximum current against destruction. Firstly, two thermal oxidation films are successively formed on the surface of the polycrystalline silicon island 23 under specific predetermined conditions. After forming the first thermal oxidation film 24, it is removed, then the second thermal oxidation film 25 is formed. As a result, the surface of the polycrystalline silicon island 23 and hence the surface of the thermal oxidation film 25 are each made substantially flat and smooth, thereby reducing regions of concentration of electric field resulting from irregularities of these surfaces. In addition, due to the thorough degree of cleansing of the surface of the polycrystalline silicon island 23 which is achieved, the level of leakage current of the completed device is made small.

Furthermore, boron is withdrawn from the P+ regions 23a at the same time that driving in of the implanted impurities in the polycrystalline silicon takes place. As a result of this withdrawal of boron, a lower surface density is produced on the upper face and side faces of the two regions positioned at opposing sides of the polycrystalline silicon island 23 on which terminal electrodes 27a and 27b of the PN junctions are formed. Due to this, the breakdown voltage of the device is increased, and a high level of maximum current against destruction is ensured for these terminal portions. The value of maximum current against destruction of each of these terminal regions of the polycrystalline silicon island 23 is determined by the distances between these regions and the electrodes 27a, 27b and 27c which are formed on the island 23. With the electrodes 27a, 27b and 27c formed at the positions shown in FIG. 5, the distances between these terminal regions and other semiconductor regions are made longer than the distances between these terminal regions and the electrodes. The resistance between these terminal regions and the other semiconductor regions is accordingly increased, thereby serving to reduce the level of leakage current.

Figure 13:
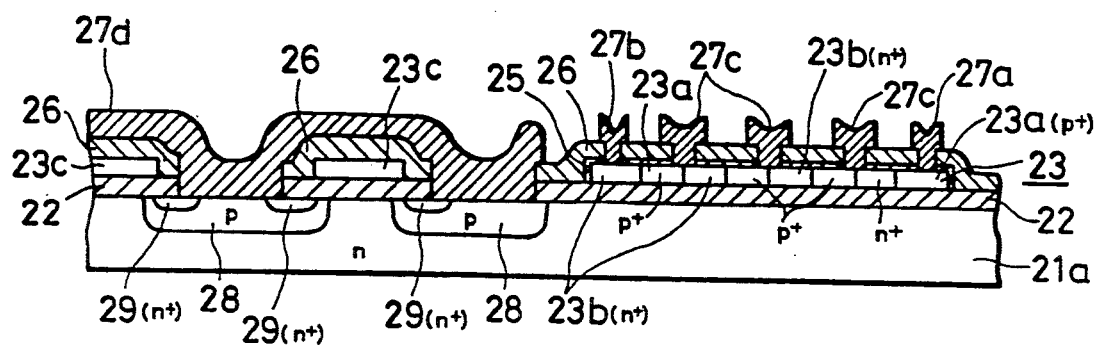
FIG. 13 is a cross-sectional view of a modification of the first embodiment of the invention.

The first embodiment of the present invention has been described above for the case of a semiconductor device which consists only of diodes formed from polycrystalline silicon upon an insulating film 22. However it is equally possible to form other semiconductor elements on the insulating film 22, or as shown in FIG. 13, to form other semiconductor elements within the semiconductor substrate. In the example of FIG. 13, an N-type semiconductor substrate 1a is utilized to form a power MOS transistor. After forming a P-type diffusion layer 28 and an N+ diffusion layer 29 within the semiconductor substrate 1a, by diffusion technology which is well known in the art, a polycrystalline silicon region 23c is selectively formed through the insulating film 22 to serve as a gate electrode of the MOS transistor. Thereafter, an inter-layer insulating film 26 and an electrode 27d are sequentially formed, by similar processing steps to those described above for the first embodiment of the present invention, to thereby configure a power MOS transistor.

Figure 14:
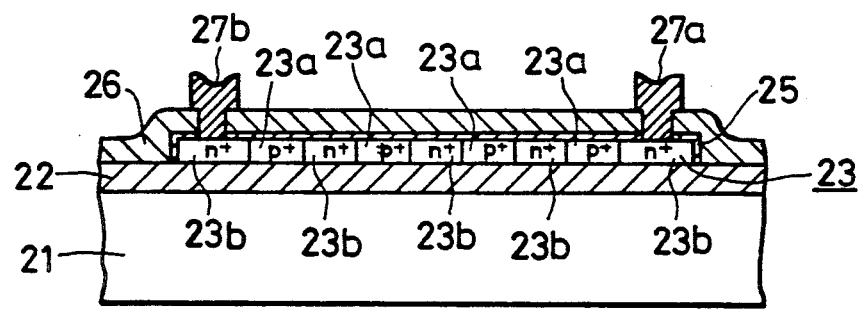
FIG. 14 is a cross-sectional view of a second embodiment of a semiconductor device according to the present invention.
Figure 15:
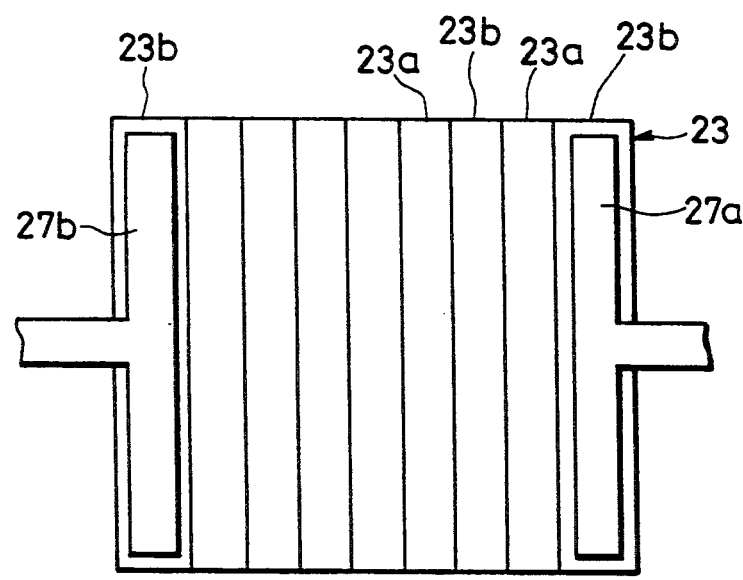
FIG. 15 is a plan view of the second embodiment.
Figure 16:
FIG. 16 is an electrical circuit diagram of the semiconductor device of the second embodiment.

A second embodiment of a semiconductor device according to the present invention will now be described, referring to FIGS. 14, 15 and 16. FIG. 14 is a cross-sectional view of the second embodiment, FIG. 15 is a plan view of the embodiment, and FIG. 16 is an electrical circuit diagram of the embodiment. The second embodiment consists substantially of the first embodiment described above, with the electrodes 27c being omitted. The second embodiment further differs from the first embodiment in that both of the outermost semiconductor regions, i.e. the terminal regions of the polycrystalline silicon island 23 on which the terminals 27a and 27b are formed, are N+ regions 23b, which are formed by selective ion implantation as described hereinabove for the first embodiment. The manufacturing process for the second embodiment is substantially identical to that of the first embodiment, so that further description will be omitted. Reference numerals in FIGS. 14 and 15 corresponding to numerals in FIGS. 4 and 5 denote identical components of the first and second embodiments. The electrical circuit of the device of the second embodiment is as shown in FIG. 16, consisting of a plurality of diodes connected in series, with the successive PN junctions thereof being of alternately opposing conduction directions. Such a device is suitable for use as a zener diode.

As described in the above, each of the embodiments of the present invention consists of a layer of polycrystalline silicon formed on a predetermined region of an insulating film which has been formed over a substrate, with a plurality of P-type regions and N-type regions each of rectangular shape being formed in the polycrystalline silicon as successive mutually adjacent pairs of a P-type region and N type region, thereby forming respective PN junctions between each of these pairs, with opposing ends of each of these PN junctions being defined by respective opposing sides of the polycrystalline silicon layer.

Furthermore with both the first and second embodiments described above, the polycrystalline silicon layer is shaped to have first and second mutually opposed sides disposed substantially mutually parallel, with first and second mutually opposed sides of each of the P-type regions and N-type regions being respectively defined by the first and second sides of the polycrystalline silicon layer.

Moreover, with both the first and second embodiments described above, as is made clear in the plan view of FIGS. 5 and 15, the polycrystalline silicon layer is formed into a substantially rectangular shape, with a third side of a first outermost region of the P-type regions and N-type regions disposed at a third side of the polycrystalline silicon layer having a third side thereof defined by that third side of the polycrystalline silicon layer and a second outermost region disposed at a fourth side of the polycrystalline silicon layer, (i.e. opposite to the first outermost region) and having a third side thereof defined by that fourth side of the polycrystalline silicon layer, and with a first terminal electrode being formed on the first outermost region and a second terminal electrode being formed on the second outermost region.

However it should be noted that the present invention is not limited to the configurations which have been described above for the first and second embodiments, and that various changes and modifications to these embodiments may be envisaged. For example, rather than forming a plurality of PN junctions on the insulating film 22, it would be equally possible to form only a single PN junction. Furthermore it would be equally possible to form two or more polycrystalline islands, with PN junctions formed in each of these.

What is claimed is:

1. A semiconductor device, comprising:
a substrate having a surface;
an insulating film covering said substrate surface;
a polycrystalline silicon layer which is formed upon a predetermined region of said insulating film, having a first end side and a second end side disposed mutually opposite and parallel to one another and both bounding a first and second end of said polycrystalline silicon layer, said polycrystalline silicon layer having at least one rectangular P-type region and at least one adjacent rectangular N-type region both of which extend completely from said first end side to said second end side, forming a PN junction therebetween extending rectilinearly from said first end side to said second end side; and
a silicon oxide film covering at least a surface portion of said polycrystalline silicon layer in which said PN junction is formed, having a smooth and flat boundary with said surface portion of said polycrystalline silicon layer.

2. A semiconductor device according to claim 1, wherein said first and second ends of said polycrystalline silicon layer include terminal portions which have a lower impurity concentration than any other portions thereof.

3. A semiconductor device according to claim 1, further comprising electrodes for applying an electric field to said PN junction formed on said rectangular P-type region and said rectangular N-type region respectively, each of said electrodes being shaped and located such that a first distance between any part of said electrode and an adjacent part of said terminal portion where it meets a PN junction, is greater than a second distance separating said any part of said electrode from a closest part of said PN junction.

4. A semiconductor device according to claim 2, further comprising electrodes for applying an electric field to said PN junction formed on said rectangular P-type region and said rectangular N-type region respectively, each of said electrodes being shaped and located such that a first distance between any part of said electrode and an adjacent part of said terminal portion where it meets a PN junction, is greater than a second distance separating said any part of said electrode from a closest part of said PN junction.

5. A semiconductor device according to claim 1, in which the polycrystalline silicon layer comprises a plurality of N-type regions and a plurality of P-type regions, the P-type and N-type regions being disposed successively alternating to form a plurality of PN junctions connected in series.

6. a semiconductor device, comprising:
a substrate having a surface;
an insulating film covering said substrate surface;
a polycrystalline silicon layer which is formed upon a predetermined region of said insulating film, having a first end side and a second end side disposed mutually opposite and parallel to one another and both bounding a first and second end of said polycrystalline silicon layer, said polycrystalline silicon layer having at least one rectangular P-type region and at least one adjacent rectangular N-type region both of which extend completely from said first end side to said second end side, forming a PN junction therebetween extending rectilinearly from said first end side to said second end side, wherein said first and second ends of said polycrystalline silicon layer include terminal portions which have a lower impurity concentration than any other portions thereof;
a silicon oxide film covering at least a surface portion of said polycrystalline silicon layer in which said PN junction is formed, having a smooth and flat boundary with said surface portion of said polycrystalline silicon layer; and
electrodes for applying an electric field to said PN junction formed on said rectangular P-type region and said rectangular N-type region respectively, each of said electrodes being shaped and located such that a first distance between any part of said electrode and an adjacent part of said terminal portion where it meets a PN junction, is greater than a second distance separating said any part of said electrode from a closest part of said PN junction.

* * * * *